United States Patent [19]

Shackleford et al.

[11] Patent Number: 5,479,356
[45] Date of Patent: Dec. 26, 1995

[54] COMPUTER-AIDED METHOD OF DESIGNING A CARRY-LOOKAHEAD ADDER

[75] Inventors: Barry Shackleford, Portola Valley; Bruce Culbertson, Palo Alto, both of Calif.

[73] Assignee: Hewlett-Packard Company, Palo Alto, Calif.

[21] Appl. No.: 31,775

[22] Filed: Mar. 15, 1993

Related U.S. Application Data

[63] Continuation-in-part of Ser. No. 599,967, Oct. 18, 1990, abandoned.

[51] Int. Cl.[6] .................................................. G06F 7/50
[52] U.S. Cl. ...................... 364/489; 364/488; 364/578; 364/787
[58] Field of Search ..................................... 364/788, 757, 364/488, 489, 578, 785, 784

[56] References Cited

U.S. PATENT DOCUMENTS

| | | | |
|---|---|---|---|
| 4,639,854 | 1/1987 | Kurokawa et al. | 364/157 |
| 4,730,266 | 3/1988 | Van Meerbergen et al. | 364/787 |
| 5,095,458 | 3/1992 | Lynch et al. | 364/787 |
| 5,126,965 | 6/1992 | Asato et al. | 364/787 |
| 5,377,122 | 12/1994 | Werner et al. | 364/578 |

FOREIGN PATENT DOCUMENTS

| | | |
|---|---|---|
| 0104845A2 | 4/1984 | European Pat. Off. |
| WO85/10807 | 4/1985 | WIPO . |
| WO91/00568 | 1/1991 | WIPO . |

OTHER PUBLICATIONS

John P. Fishburn, "A Depth-Decreasing Heuristic for Combinational Logic or How to Convert a Ripple-Carry Adder into a Carry-Lookahead Adder or Anything In-Between", 27th ACM/IEEE Design Automation Conference, 1990, pp. 361–364.

Mekhallalati et al., "New Parallel Multiplier Design", Electronics Letters, 13th Aug. 1992, vol. 28, No. 17, pp. 1650–1651.

M. E. David and C. W. Gwyn, "CAD Systems for IC Design", IEEE Transactions on CAD, vol. CAD–1, No. 1, Jan. 1982.

Pak K. Chan et al., "Delay Optimization of Carry–Skip Adders and Block Carry–Lookahead Adders Using Multidimensional Dynamic Programming", IEEE Transactions on Computers, vol. 41, No. 8, Aug. 1992, pp. 920–930.

*Primary Examiner*—Kevin J. Teska
*Assistant Examiner*—Thai Phan

[57] ABSTRACT

Using a computer-aided method to design carry-lookahead adders to add two binary numbers and an input carry bit. In the first preferred embodiment, a length-number and a blocks-in-group number are entered into the computer by a user. The computer, responding to the length-number automatically designs a first structure with a plurality of logic blocks. Using the blocks-in-group number entered, the computer designs a second structure specifying the number of preceding-level logic blocks to be grouped into next-level logic blocks. Then, the computer automatically designs one or more next-level logic blocks. The first structure receives the binary numbers and produces the propagate and the generate bit. The logic blocks in the second structure receive bits from preceding-level logic blocks and operate on bits in parallel to produce the output carry bit of the adder. Based on the few numbers entered, the computer formulates the logic circuits to produce the output-carry bit and the sum bits of the adder. In a second preferred embodiment, the output-carry bit is formed with some rippling of the carry bit from one block to the next.

5 Claims, 9 Drawing Sheets

5,479,356

COMPUTER-AIDED METHOD OF DESIGNING A CARRY-LOOKAHEAD ADDER

This is a continuation-in-part of U.S. patent application S/N 599,967, filed Oct. 18, 1990, now abandoned and incorporated by reference into this application.

BACKGROUND OF THE INVENTION

The present invention relates generally to computer-aided methods of designing an electronic device and more particularly to a computer-aided method of designing a carry-lookahead adder.

An adder is a device that adds two binary numbers and an input-carry bit to produce a binary sum and an output-carry bit. Typically, there are two types of adders, a ripple adder and a carry-lookahead adder. A ripple adder propagates or ripples the carry bit of the adder from the least significant bit to the most significant bit, one bit at a time, to generate both the sum bit and the output-carry bit. A carry-lookahead adder produces the output-carry bit by simultaneously operating on the input-carry bit and some or all of the bits of the binary numbers.

FIG. 1 shows a part Y of a one-bit adder. It produces an output-carry bit $C_1$ from input data bits $a_1$ and $b_1$ and an input-carry bit $C_2$. The logic that produces the output sum bit of the adder is not shown in the figure. The logic product (AND) of the input data bits is called the generate bit G, and the logic sum (OR) of the input data bits is called the propagate bit P.

FIG. 2 shows a schematic diagram of a part of a four-bit ripple adder. Each rectangular box Y with a dashed outline can be substituted by the dashed box Y in FIG. 1. The output sum bits are again not shown in the Figure. The most significant bit is represented by the smallest subscript, whereas the least significant bit is represented by the largest subscript. To produce the output-carry bit $C_0$, the input-carry bit $C_4$ has to ripple through each one-bit adder; this rippling process delays the response time of the circuit.

A carry-lookahead adder takes less time to produce the sum and output-carry bits because it operates on some or all of the bits of the binary numbers in parallel. FIG. 3 shows part of a two-bit carry-lookahead adder (logic that produces the sum bits has been omitted). Each box marked X can be substituted by the box X in FIG. 1.

As the number of bits in each binary number increases, the complexity of the carry-lookahead adder increases. The box marked W in FIG. 3 has only a single level of AND gates, but as the number of bits increases, fan-in and fan-out limitations result in an increasing number of levels of gates. Even so, a carry-lookahead adder takes significantly less time to produce the output carry and sum bits than a ripple adder.

Increasing the number of bits of a ripple adder is easily accomplished by simply stringing additional one-bit adders together in series, following the pattern of FIG. 2. If the circuit is being designed by means of a computer-aided tool, all that is necessary is for a designer to inform the computer of the number of bits desired.

on the other hand, the design of a carry-lookahead adder changes as the number of bits changes, as shown by comparing FIGS. 3 to 4, a two-bit adder to a three-bits adder. In addition, fan-in and fan-out rules, which in general are different for different gate technologies, must be taken into account. For these reasons, changing or tuning a carry-lookahead adder during a typical design process can be quite tedious.

It would be beneficial if there were a method of designing a carry-lookahead adder automatically by means of a computer-aided system.

SUMMARY OF THE INVENTION

The present invention provides a computer-aided method that reduces the complexity of designing carry-lookahead adders. In a first preferred embodiment, the computer implements the adder automatically from two entered numbers that capture the essence of a design. In the past, carry-lookahead adders had to be redesigned manually in the gate level to test different ideas. By this invention, one only needs to change the two numbers and the carry-lookahead adders are automatically redesigned by the computer.

The carry-lookahead adder in the invention is of the kind that adds two binary numbers and an input-carry bit. In the first preferred embodiment, a length number and a blocks-in-group number are entered into a computer by a user. The computer, responding to the length-number, automatically designs a first structure with a plurality of logic blocks. Each such block has a circuit to receive one bit from each binary number and to produce a propagate and a generate bit.

Responding to the blocks-in-group number, the computer automatically designs a second structure by arranging the preceding-level logic blocks into one or more groups. Each group has the specified blocks-in-groups number of preceding-level logic blocks, except that one group may have less than the number of blocks if there are not enough blocks. Then the computer creates a next-level logic block for each group. Each next-level logic block has a logic circuit that receives the propagate and generate bits from all the blocks in a group of preceding-level logic blocks. Each next-level logic block also produces a propagate bit PLp and a generate bit GLp. If the number of logic blocks designed in the preceding step has more than one block, the computer automatically repeats the design process from the step of "arranging the preceding-level logic blocks into one or more groups" until the number of logic blocks designed in the preceding step is one.

Then, the computer formulates a final logic circuit to produce an output-carry bit of the adder from the input-carry bit and from the propagate PLp and generate GLp bits formed in the preceding step. The output-carry bit is equal to (the Propagate bit PLp * the input-carry bit + the Generate bit GLp).

In the first embodiment, the output carry bit of the adder is formed by operating in parallel on the bits in the binary numbers. In a second preferred embodiment, there is some rippling of carry bits from one block to the next in forming the output-carry bit of the adder.

In the second preferred embodiment, the computer receives a length number and a blocks-in-group number entered by a user. Then the computer generates the first and the second structures as in the first embodiment except that the condition controlling the termination of the design process is different. The design process is repeated if the number of next-level logic blocks designed is more than the blocks-in-group number. If the number of next-level logic blocks is not more than the blocks-in-group number, then the logic blocks designed in the preceding step are joined sequentially.

The first logic block in the joint sequence receives the input-carry bit of the adder. Every logic block sequentially generates a carry bit that is received by its immediately next logic block and that is equal to (its PLp * its received carry bit + its GLp). The carry bit generated by the last logic block in the sequence is an output-carry bit of the adder.

Thus, based on the numbers entered, the computer automatically formulates the logic circuits to generate the output-carry bit of the carry-lookahead adder. The numbers are entered into the computer in any convenient way, for example, through a text editor or a graphical editor.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

The present invention provides a computer-aided method of designing a carry-lookahead adder. With this method, a designer can easily design the adder by just entering two or more numbers into the computer that incorporates the computer-aided method. This is especially beneficial during a typical design process where a design has to be tuned to test different ideas.

Figure 5:
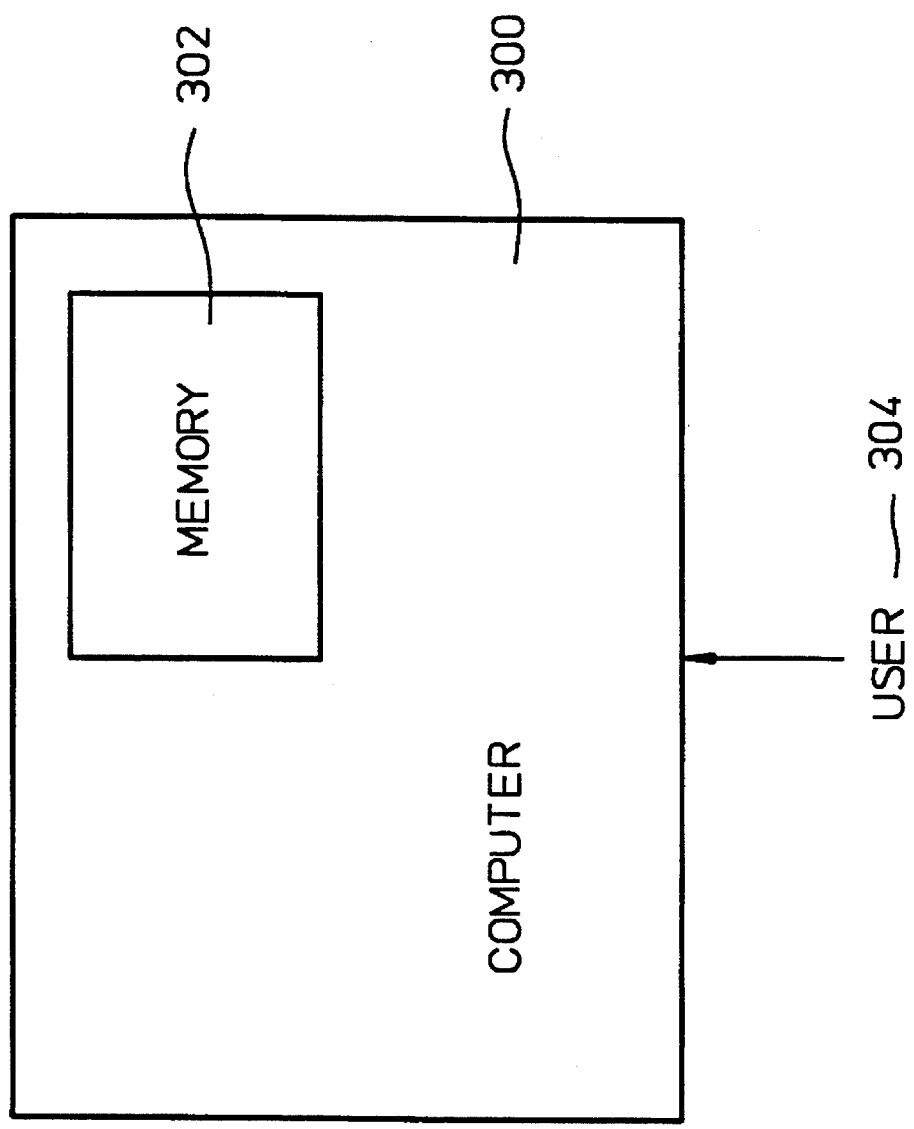
FIG. 5 illustrates a computer that has incorporated the computer-aided method in the present invention.

FIG. 5 shows a computer 300 with a memory 302 that has incorporated the computer-aided method. A user 304 enters two or more numbers into the computer 300, and a carry-lookahead adder is automatically designed.

Figure 6:
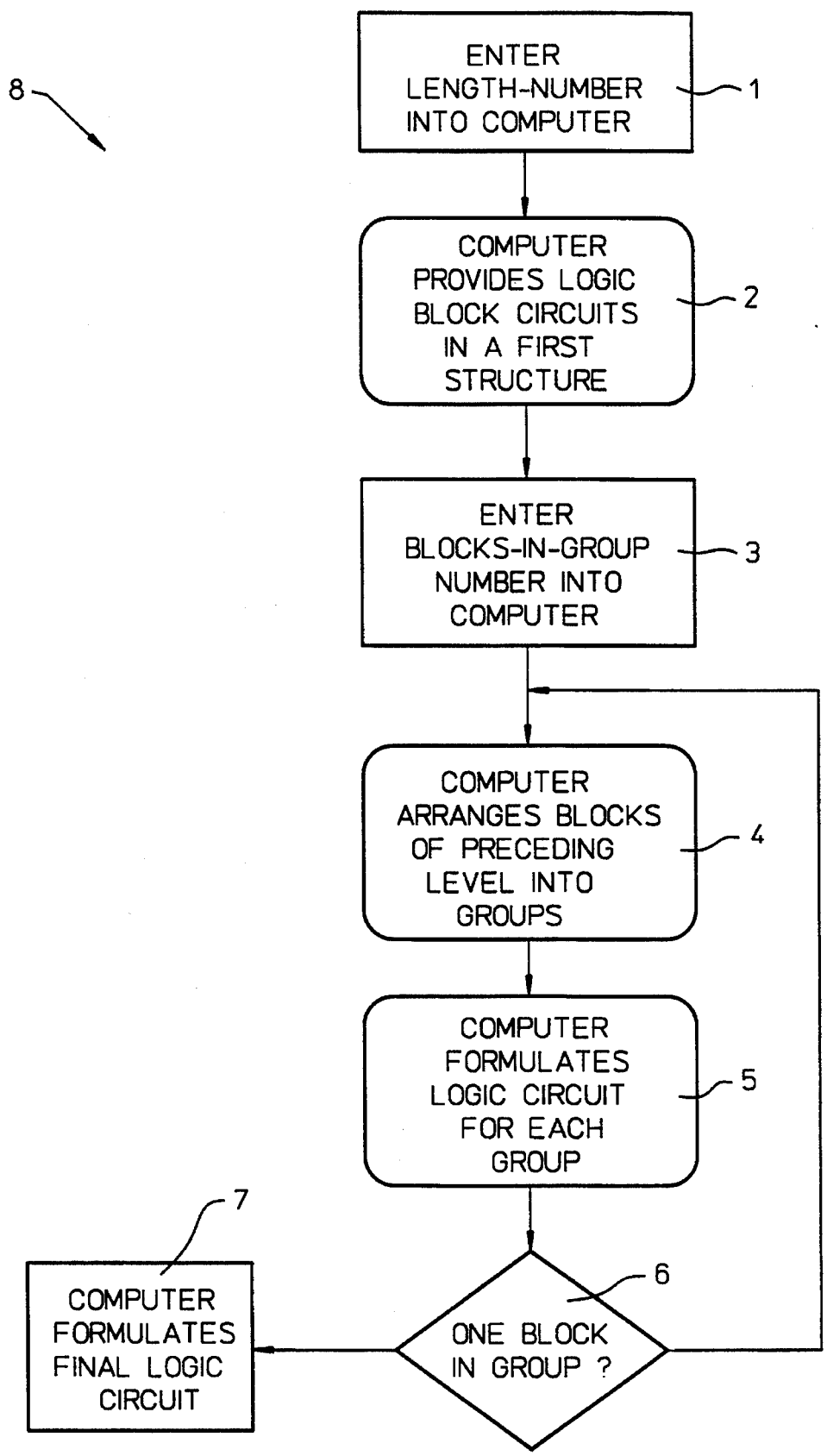
FIG. 6 shows a flow-chart illustrating a first preferred embodiment of the present invention.
Figure 7:
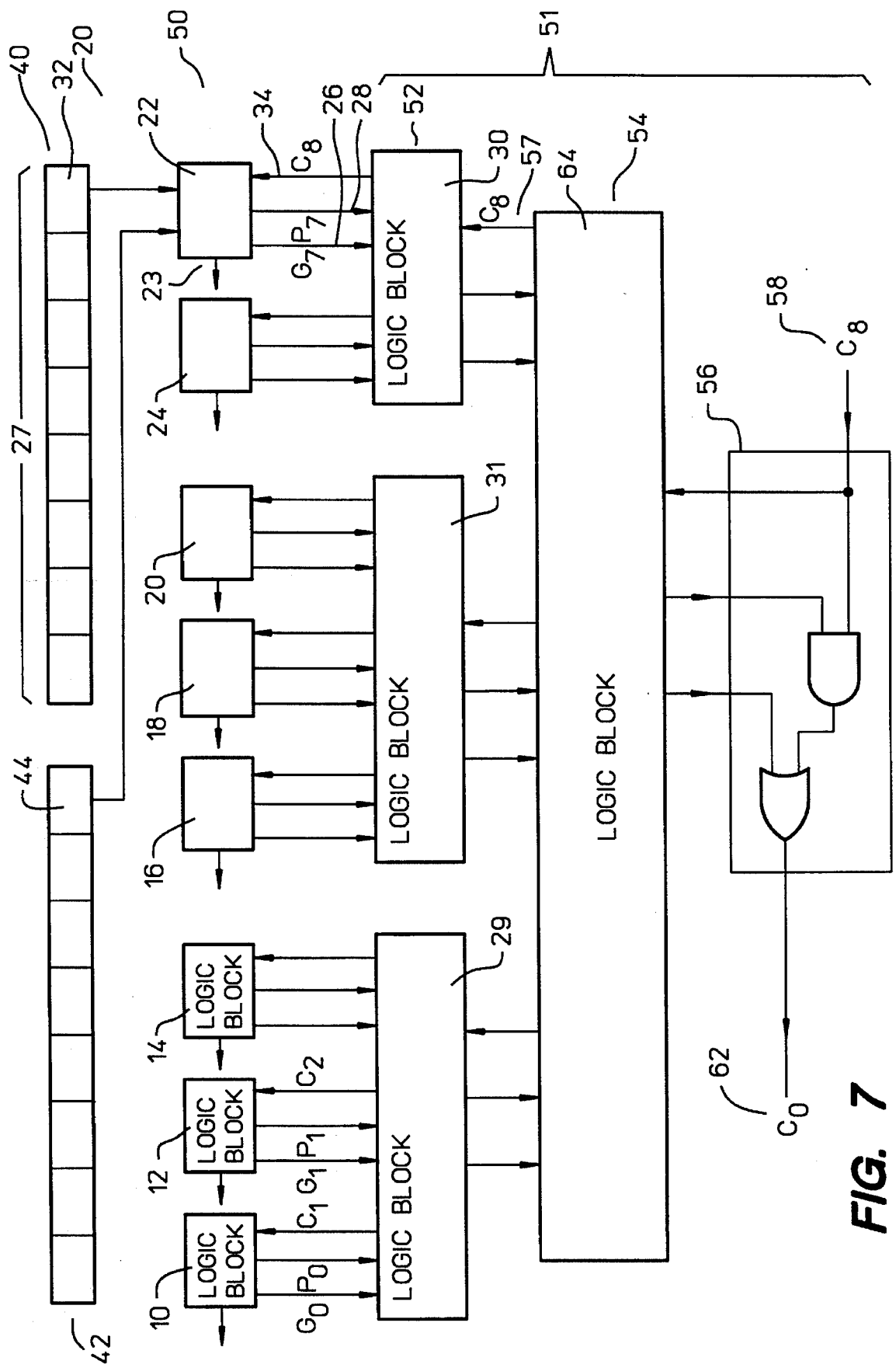
FIG. 7 shows a representation of an eight-bit carry-lookahead adder designed by the first preferred embodiment of the invention.

FIG. 6 shows a flow-chart illustrating the steps in a first preferred embodiment of the present invention for designing a carry-lookahead adder of the kind that adds two binary numbers and an input-carry bit. FIG. 7 illustrates a representation of an eight-bit carry-lookahead adder designed by the first preferred embodiment of the invention.

In the first preferred embodiment 8, a length-number is entered (step 1) into the computer by a user. The number specifies the length in bits, 27, of the binary numbers 40 and 42 to be added; in the example shown in FIG. 7, the length-number is 8 because each input number has 8 bits. The computer, responding to the length-number entered, automatically designs (step 2) a first structure 50, with a plurality of logic blocks, such as 10 through 24. For each logic block, the computer formulates a logic circuit to receive one bit from each binary number; for example, block 22 receives bits 32 and 44. Each block also produces two bits, a propagate bit and a generate bit; for example, the block 22 produces the propagate bit 26 and the generate bit 28. The propagate bit is the logic sum of the received bits of that block, and the generate bit is the logic product of the received bits of that block.

A blocks-in-group number is entered (step 3) into the computer by a user; in the example shown in FIG. 7, that number is 3. The computer, responding to the blocks-in-group number, automatically provides a second structure 51 which arranges the preceding-level logic blocks into one or more groups (step 4), such as blocks 10, 12 and 14 are arranged into one group. Each group has the specified blocks-in-group number of blocks, except for one group which may have less than that number of blocks if there are not enough blocks. In the example shown in FIG. 7, blocks 22 and 24 are arranged in a group with less than the blocks-in-group number of blocks.

The computer then automatically creates one or more next-level logic blocks, and formulates (step 5) for each next-level logic block a logic circuit that receives the propagate and generate bits from all of the blocks in one of the groups of preceding-level logic blocks. For example, next-level logic block 30 receives the propagate and generate bits from blocks 22 and 24. From the received bits, the logic circuit produces a propagate PLp and a generate GLp bit as follows:

$$PLp = P0 * P1 * \ldots * P(n-1); \quad (1)$$

$$GLp = G0 + (G1 * P0) + (G2 * P0 * P1) + \ldots + (G(n-1) * P0 * \ldots * P(n-2)); \quad (2)$$

where P0 to Pn−1 are the received propagate bits; and G0 to Gn−1 are the received generate bits. The computer uses standard circuit techniques to generate the logic circuit; for example, an AND gate with the required number of inputs to produce the bit PLp.

If the number of next-level logic blocks designed in the preceding step is more than one, the computer automatically repeats from step four until the number of logic blocks designed in its preceding step is one (step 6). In the example shown in FIG. 7, three next-level logic blocks are created, namely 29, 30 and 31. The number of logic blocks created is more than one, so the computer automatically repeats from step 4 to create another level of logic blocks. After this level of logic block is created, the repeating process stops because this level has just one block 64.

The reason for additional levels is because for every technology, there is usually an optimum fan-in and fan-out, beyond which circuit performance begins to suffer. A typical fan-in is four. If the binary numbers to be added have many bits, many levels might be preferred to enhance the performance of the adder.

In the last step, a final logic circuit 56 is created (step 7) using the input-carry bit 58, the propagate PLp and generate GLp bits produced by the preceding level 54. The final logic circuit produces the output-carry bit 62 of the adder 20 as follows:

$$C0 = (PLp * \text{input-carry bit}) + GLp.$$

One preferred position to produce the sum bits of the adder is in the logic blocks of the first structure 50. This is achieved by first coupling the input carry bit from the final logic circuit 56 to its preceding-level logic block 64. Then a carry bit created by each logic block in the second structure 51 is coupled to each of its corresponding preceding-level-logic blocks; for example, the block 64 produces a carry bit 57 for block 30. The block 64 has three preceding-level logic blocks 29, 30 and 31, so it creates three carry bits and couples one to each preceding-level logic block. If the three carry bits are C0, C1 and C2, then their equations as follows:

C2=the carry bit received by block 64, presently C8;
C1=(C2*P2)+G2; and
C0=(C2*P2*P1)+(G2*P1)+G1;

where P2-P0 are the received propagate bits, and G2-G0 are the received generate bits by block 64.

In general, if a logic block has n+1 received propagate bits, n+1 received generate bits and a received carry bit, then its output carry bits are as follows:

$C_n$ = the carry bit received by the logic block;
$C(n-1) = (C_n * P_n) + G_n$;

$\cdot$
$\cdot$
$\cdot$ $CO = (C_n * P_n * \ldots * P1) + (G_n * P(n-1) * \ldots * P1) + \ldots + G1$.

As explained, a carry bit is created by each logic block in the second structure 51 and coupled to each of its corresponding preceding-level logic blocks. This leads to every logic block in the first structure 50 receiving a carry bit from a logic block in the second structure 51; for example, the logic block 22 receives a carry bit 34 from the logic block 30. Each logic block in the first structure produces a sum bit; for example, the logic block 22 receives a carry bit 34 and produces a sum bit 23. The equation defining a sum bit for each logic block in the first structure is as follows:

Half-sum=XOR(its received bits from the 2 binary numbers); (3)

Sum bit=XOR(its received carry bit, half-sum); (4)

where XOR=the logic operation of Exclusive-Or.

In the first preferred embodiment, two numbers are entered into the computer, a length number and a blocks-in-group number. The block-in-group number is used to arrange preceding-level logic blocks into one or more groups. In another embodiment, a list of blocks-in-group numbers are entered into the computer. The numbers are used to arrange preceding-level logic blocks into many groups. Each group has one of the entered blocks-in-group numbers of blocks. For the adder shown in FIG. 7, the list of numbers for the first level 52 is (3, 3, 2)—indicating that the first group has three blocks, the second group has three blocks and the third has two. The list of number for the second level is just (3). So, the total list of numbers, called size-lists-of-lists, to be entered into the computer is ((3, 3, 2), (3)).

Thus, according to the numbers entered, the computer formulates the logic circuits to produce the sum bits together with the output-carry bit of the carry-lookahead adder.

Figure 8:
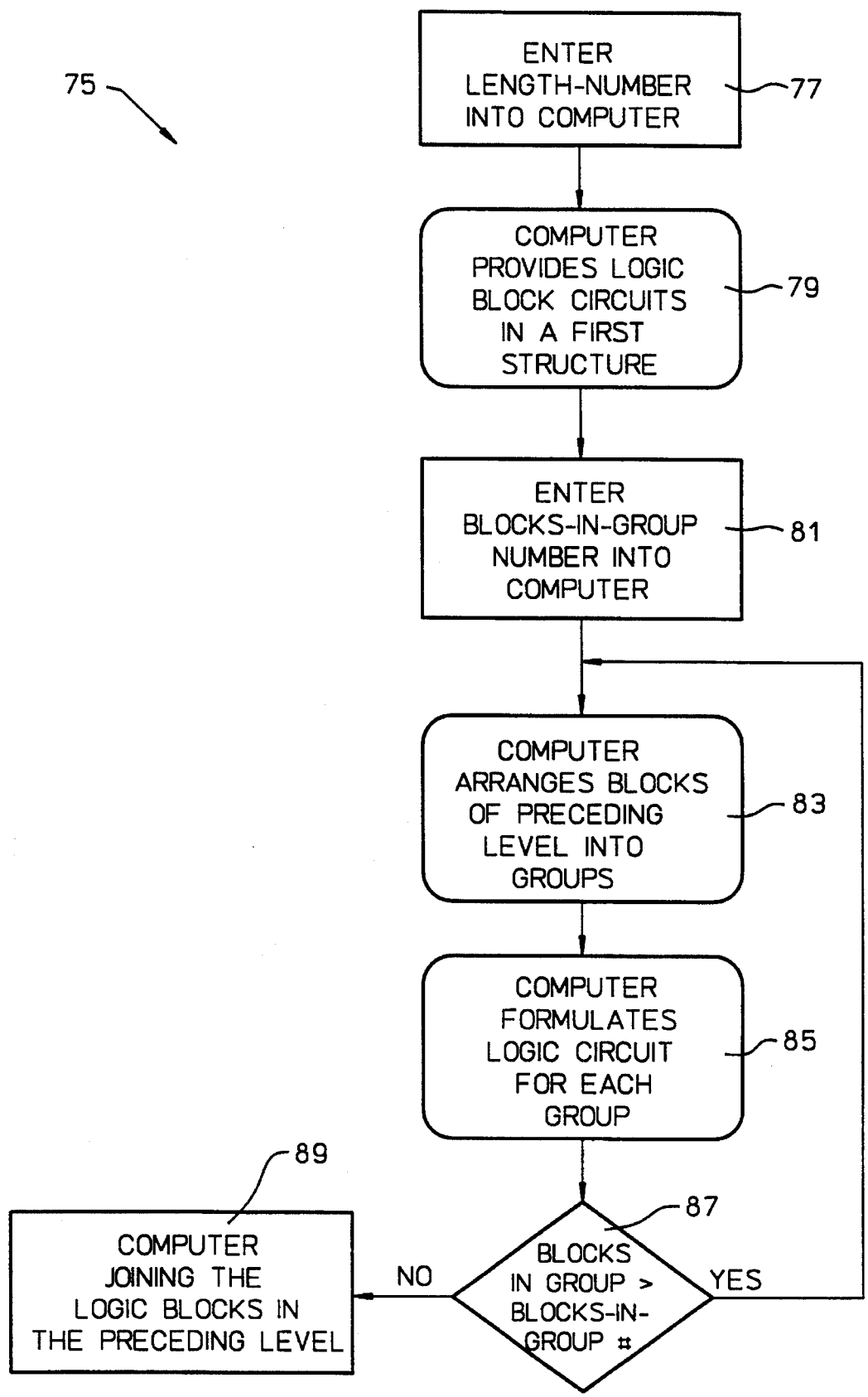
FIG. 8 illustrates a flow-chart illustrating a second preferred embodiment of the present invention.
Figure 9:
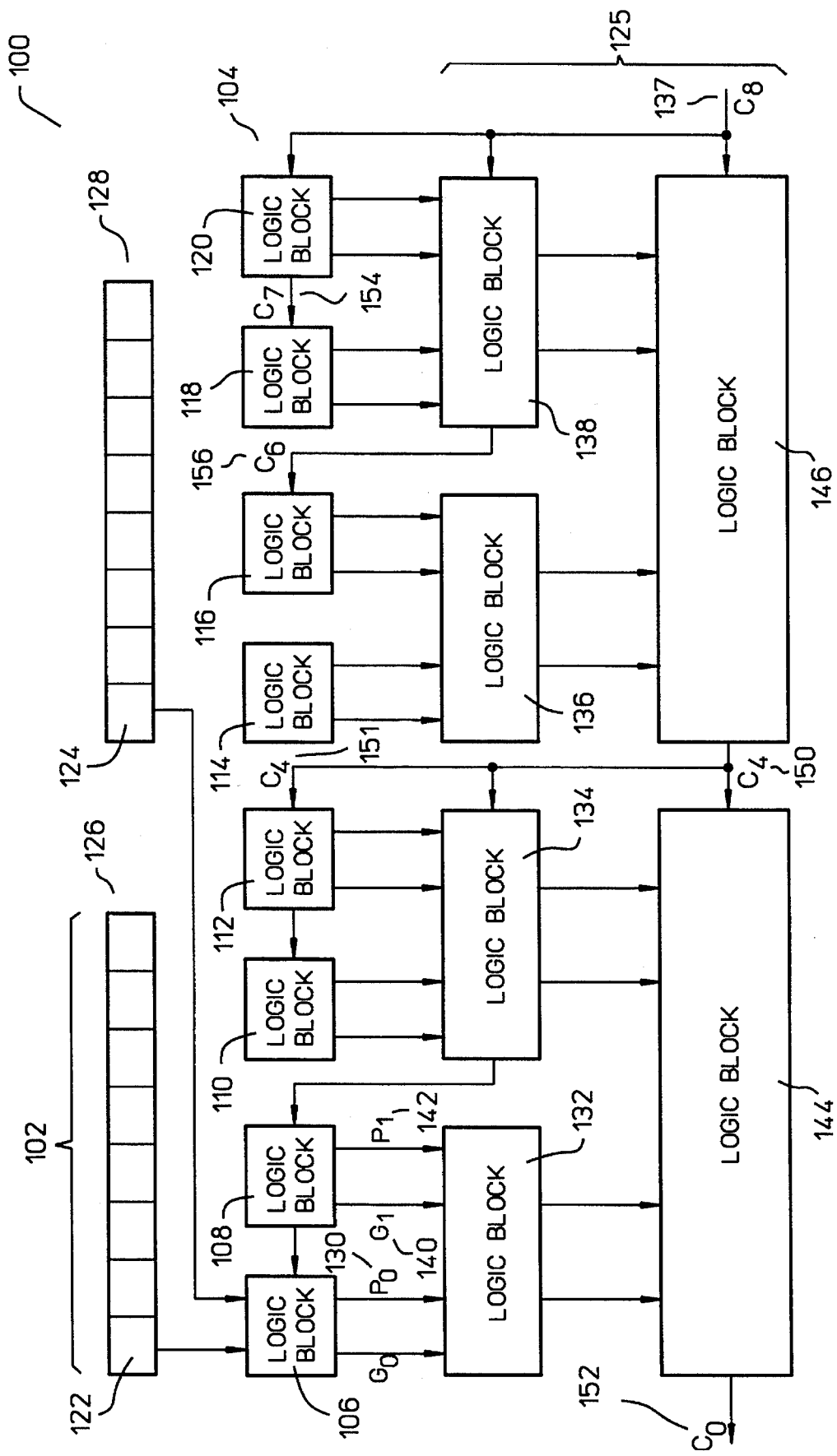
FIG. 9 shows a representation of an eight-bit carry-lookahead adder designed by the second preferred embodiment of the invention.

FIG. 8 shows a flow-chart illustrating the steps in the second preferred embodiment of the present invention for designing a carry-lookahead adder of the kind that adds two binary numbers 126 and 128, and an input-carry bit 137. FIG. 9 shows a representation of an eight-bit carry-lookahead adder 100 designed by the second preferred embodiment of the invention.

In the second preferred embodiment 75, again a user enters two numbers into the computer, a length-number and a blocks-in-group number. The length number, 27, specifying the length in bits, 102, of the binary numbers to be added is entered into the computer (step 77); in the example shown in FIG. 9, the length-number is 8 because each input number has 8 bits. The computer, responding to the length-number entered, automatically designs (step 79) a first structure 104, with logic blocks 106 through 120. For each logic block, the computer formulates a logic circuit to receive one bit from each binary number; for example, the block 106 receives bits 122 and 124 from the binary numbers 126 and 128 respectively. Each block also produces two bits, a propagate bit and a generate bit; for example, the block 106 produces the propagate bit 130 and the generate bit 132. The propagate bit is the logic sum of the received bits of that block, and the generate bit is the logic product of the received bits of that block.

In the example shown in FIG. 9, the second number, the blocks-in-group number being entered into the computer (step 81) is 2. The computer responding to the blocks-in-group number, automatically provides a second structure 125 which arranges the preceding-level 104 logic blocks into one or more groups (step 83). For example, the preceding-level blocks 106 and 108 are arranged into one group. Each group has the specified blocks-in-group number of blocks, except for one group which may have less than that number of blocks if there are not enough blocks.

Then the computer (step 85) automatically creates a next-level logic block for each group, and formulates for each logic block a logic circuit. The logic circuit receives the propagate and generate bits from all of the blocks in one of the groups of preceding-level logic blocks. For example, the computer creates the next-level logic blocks 132, 134, 136 and 138. The next-level logic block 132 receives the propagate bits 130 and 142 and the generate bits 132 and 140 from the preceding-level logic blocks 106 and 108.

From the received bits, each logic circuit produces a propagate PLp bit as in equation 1, and a generate GLp bit as in equation 2. For example, the logic circuit in the logic block 132 generates bits as follows:

PLp=P0*P1; and

GLp=G0+G1*P0.

If the number of logic blocks designed in the preceding step is more than the blocks-in-group number (step 87), the computer automatically repeats from the step of "arranging the preceding-level logic blocks into one or more groups" (step 83) until the number of logic blocks designed in its preceding step is not more than the blocks-in-group number.

In the example shown in FIG. 9, the number of logic blocks designed in the preceding step is 4 which is more than the blocks-in-group number 2. The computer then automatically arranges the 4 preceding-level logic blocks into 2 groups and creates two next-level logic blocks 144 and 146. In this level, there are only two blocks which is not more than the blocks-in-group. The computer proceeds into the final step.

In the final step (step 89), the computer sequentially joins together the one or more logic blocks in the preceding level; for example, blocks 144 and 146 are sequentially joined together. The first block 146 in the sequence receives the input-carry bit 137 of the carry-lookahead adder 100. Every logic block in the final level sequentially generates a carry bit that is coupled to its immediately next logic block; for example, the logic block 146 generates a carry bit 150 which is received by its immediately next logic block 144. Then the next logic block 144 generates a carry bit 152. The carry bit generated by each logic block is equal to (its produced propagate bit PLp * its received carry bit + its produced generate bit GLp). The carry bit generated by the last logic block 144 in the final level is the output carry bit 152 of the adder 100.

In the second preferred embodiment, two numbers, the length number and the blocks-in-group number, are entered into the computer. The blocks-in-group number is used to arrange preceding-level logic blocks into one or more groups. In another embodiment of the invention, a list of blocks-in-group numbers is entered into the computer. The numbers are used to arrange preceding-level logic blocks into many groups.

Each group uses one of the entered blocks-in-group numbers to specify the number of preceding-level logic blocks in the group. One or more levels of logic blocks are then formed until all the entered blocks-in-group numbers are used. If the number of logic blocks designed in the preceding step has used up all the entered numbers, then the computer, 89, joins sequentially the logic blocks designed in the preceding step.

For the adder shown in FIG. 9, the list of numbers for the first level in the second structure is (2, 2, 2, 2)—indicating each group has two blocks. The list of number for the second level is (2, 2). The total list of numbers, called size-lists-of-lists to be entered into the computer is ((2, 2, 2, 2), (2, 2)).

Thus, according to the numbers received, the computer formulates the logic circuits for the output-carry bit 142 of the carry-lookahead adder 100. The logic circuits of the carry-lookahead adder can be tuned by changing the numbers entered into the computer, which is done in any convenient way, for example, through a text editor or through a graphical editor.

Figure 1:
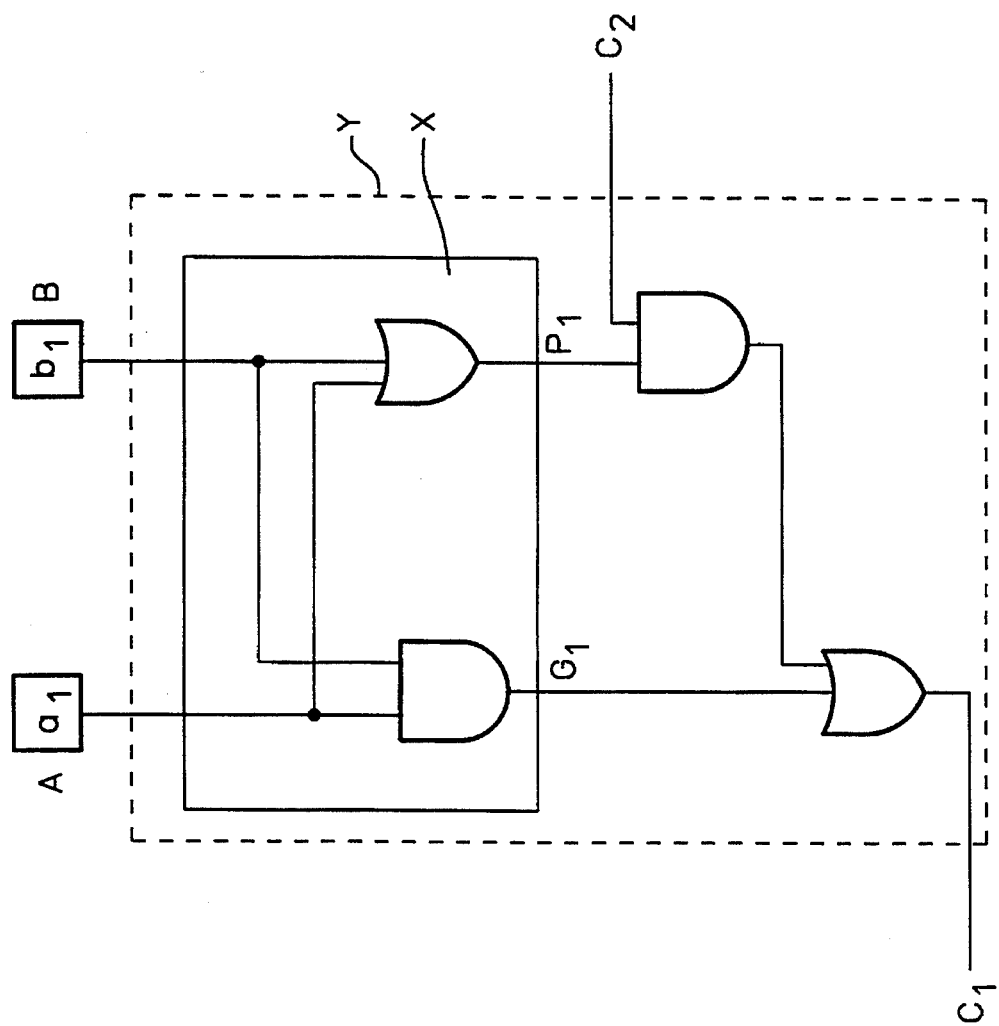
FIG. 1 shows a part of a one-bit adder in the prior art.
Figure 2:
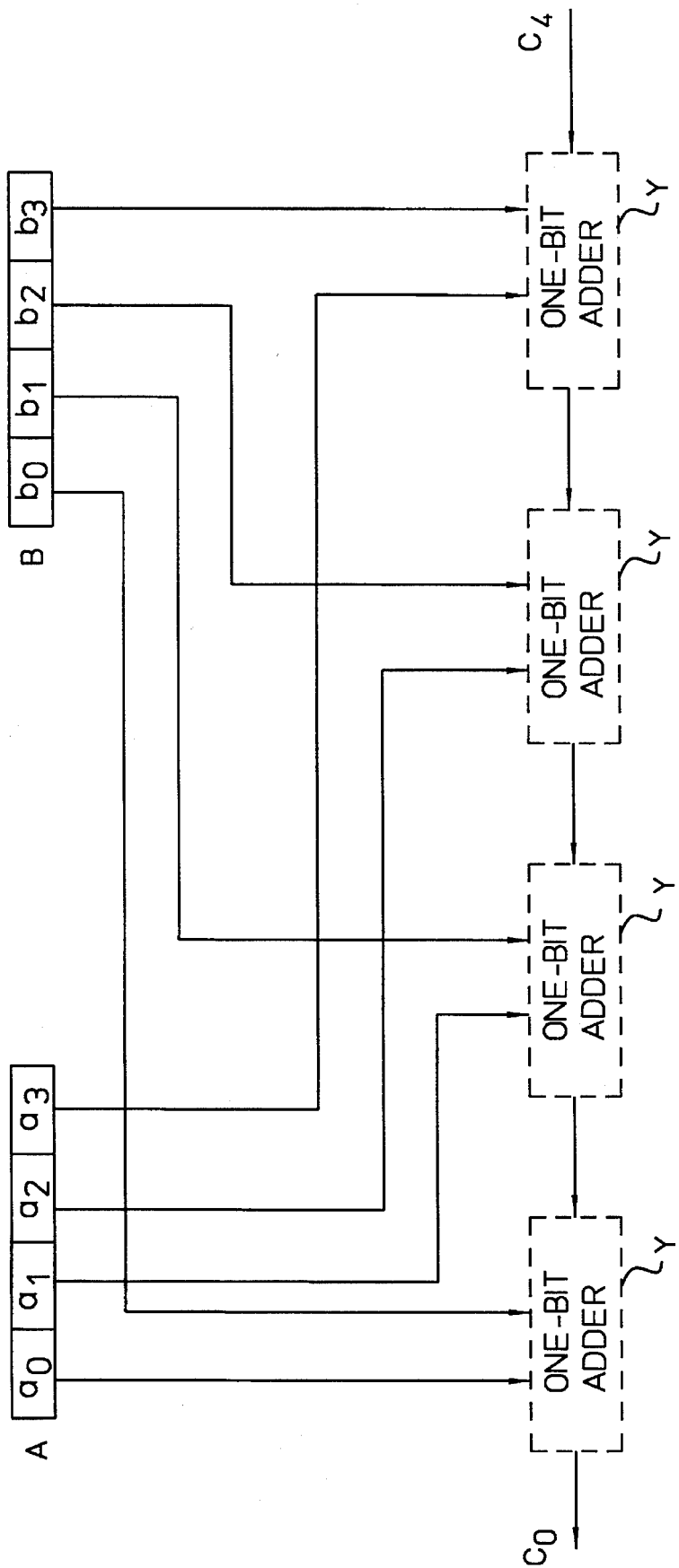
FIG. 2 shows a part of a four-bit ripple adder in the prior art.
Figure 3:
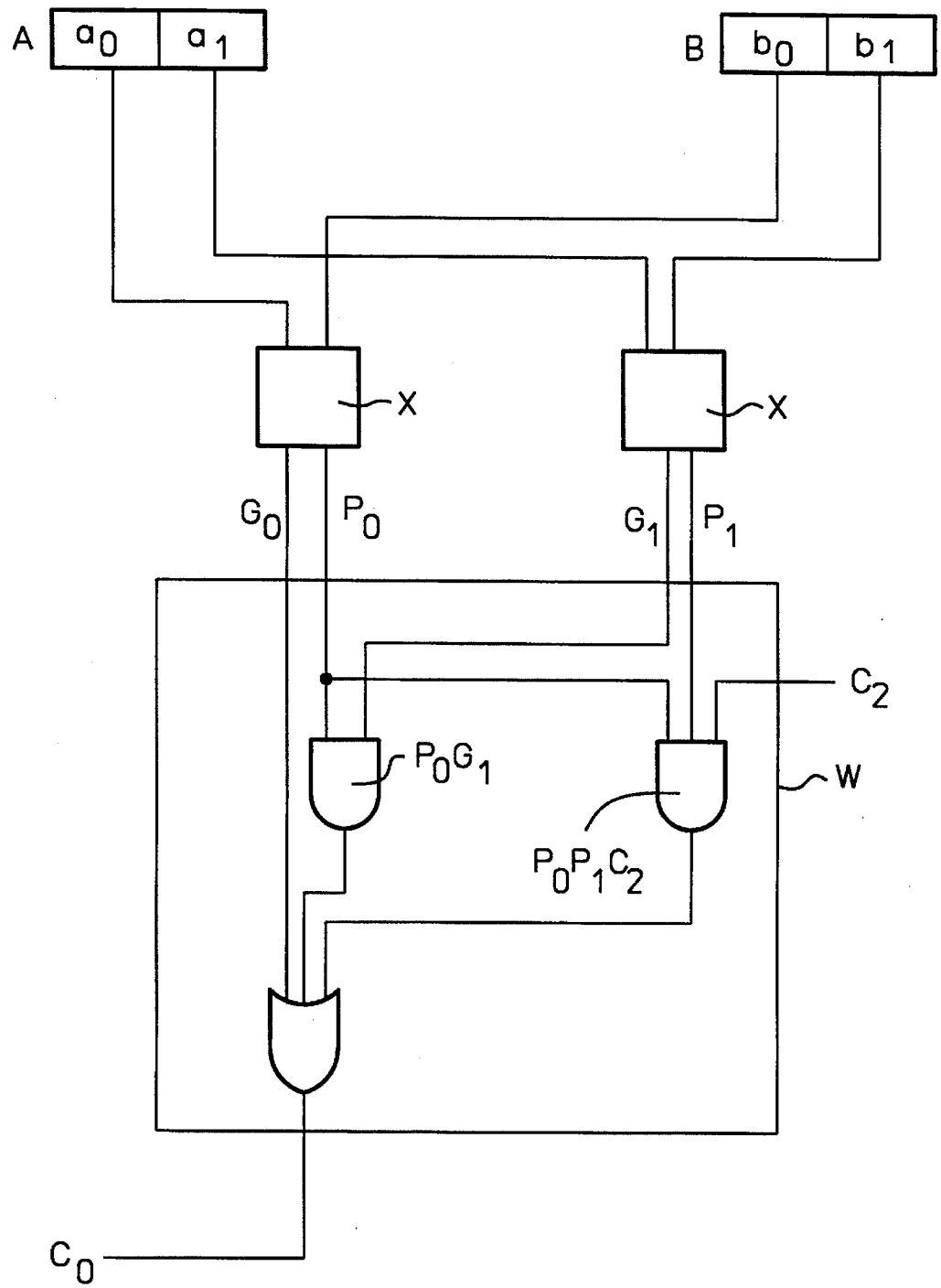
FIG. 3 shows a part of a two-bit carry-lookahead adder in the prior art.
Figure 4:
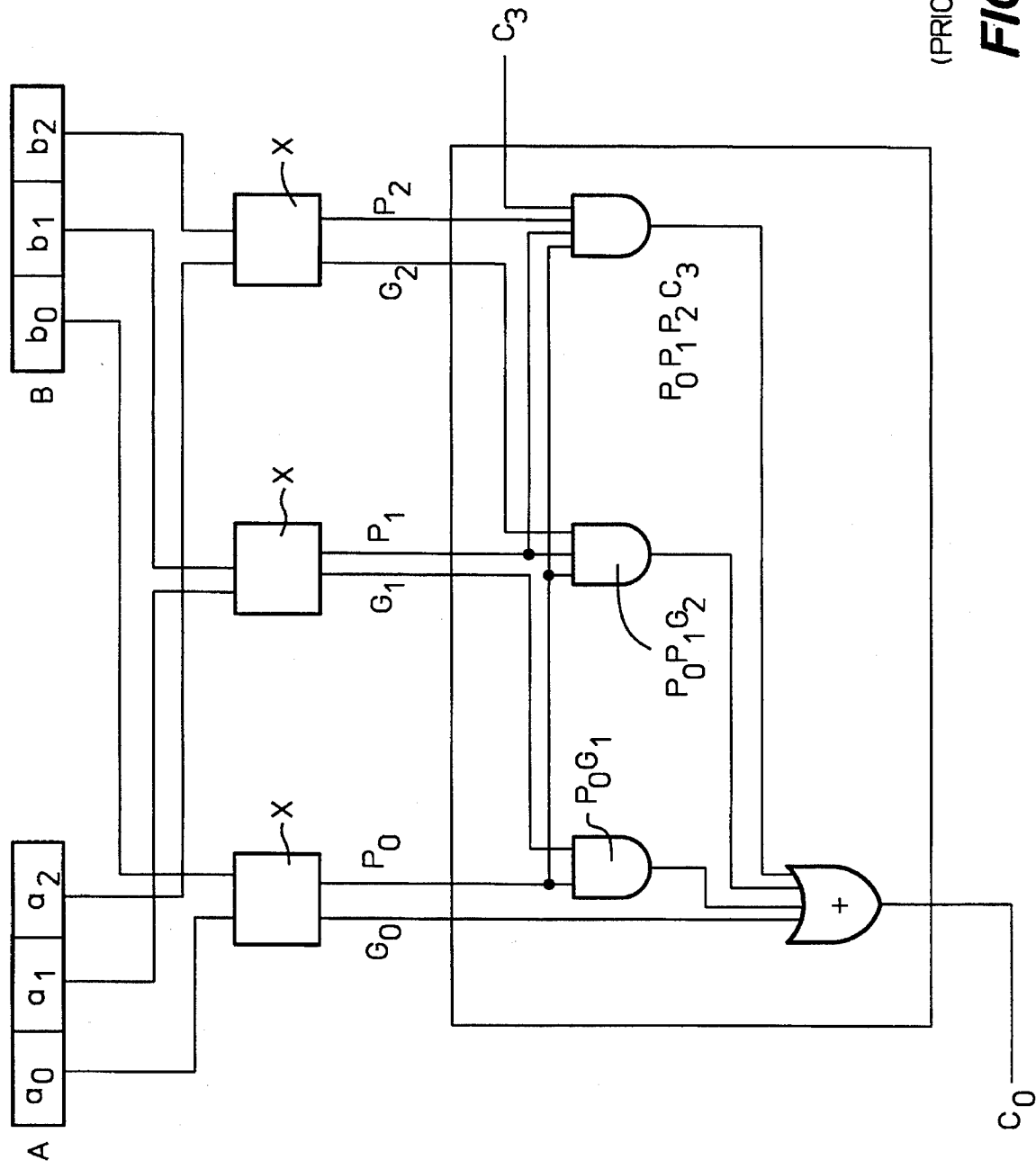
FIG. 4 shows a part of a three-bit carry-lookahead adder in the prior art.

FIG. 9 illustrates one way to formulate the sum in the logic blocks in the first structure 104. The input-carry bit 137 is fed into the logic block 120, which with its received bits from the binary numbers 126 and 128, forms a sum bit and a carry bit 154. One way to generate the logic circuit for the carry bit 154 is as shown in FIG. 1; and one way to generate the sum bit is as shown in equation 3 and 4.

The carry bit 154 is received by the next logic block 118 to generate its sum bit and carry bit. While ripple adding is being done, the carry bit 156 from the logic block 118 is generated in parallel by the logic block 138 in the first level of the second structure. Similarly, the carry bit 151 for the block 112 in the first structure 104 is generated in parallel by the logic block 146 in the second structure 125.

The invention will be further clarified by a consideration of the following example, which is intended to be purely exemplary of the use of the invention.

```
**************************************************
** Example: A pseudo-code showing how to implement the
** invention.
** The inputs to the carry-lookahead adder are two
** multi-bit numbers, A and B, and a 1-bit carry-in
** number.
** A and B should each have the same number of bits.
** The outputs of the carry-lookahead adder are the
** multi-bit sum and a 1-bit carry-out.
**
** a-list              a list of all the bits which
**                     represent the A input
** b-list              a list of all the bits which
**                     represent the B input
** carry-in            the input-carry bit of the adder
** carry-out           the output-carry bit of the adder
** sum-list            a list of all the bits which
**                     represent the sum output
** size-lists-of-lists a list representing number of
**                     blocks arranged together in each
**                     level
**************************************************
synthesize-cla-adder (a-list, b-list, sum-list, carry-in,
         carry-out, size-list-of-lists)
begin
   bus-width = number of elements in a-list
   propagate-list = generate-list-of-unique-names
                  (bus-width)
   generate-list = generate-list-of-unique-names
                  (bus-width)
   carry-list = generate-list-of-unique-names
                  (bus-width - 1)
   prepend carry-in to the front of carry-list
   synthesize-zeroth-level-blocks (a-list, b-list,
         sum-list, carry-list, propagate-list,
         generate-list)
   synthesize-cla-levels (carry-list, carry-out,
         propagate-list, generate-list,
         size-list-of-lists)
end

**************************************************
** Synthesize zeroth-level blocks.
**************************************************
synthesize-zeroth-level-blocks (a-list, b-list, sum-list,
         carry-list, propagate-list, generate-list)
begin
   bus-width = number of elements in a-list
   for i = 1 to bus-width begin
      synthesize-one-zeroth-level-block (
            i'th element of a-list,
            i'th element of b-list,
            i'th element of sum-list,
```

```
                    i'th element of carry-list,
                    i'th element of propagate-list,
                    i'th element of generate-list)
            end
    end

*************************************************************
    ** Synthesize one zeroth-level block.
    **
    ** half-sum                an intermediate variable
    *************************************************************
    synthesize-one-zeroth-level-block (a, b, sum, carry-in,
            propagate, generate)
    begin
        emit-gate (AND, generate, list of a and b)
        emit-gate (OR, propagate, list of a and b)
        half-sum = generate-unique-name
        emit-gate (XOR, half-sum, list of a and b)
        emit-gate (XOR, sum, list of half-sum and carry-in)
    end

*************************************************************
    ** Synthesize the multi-level carry-lookahead circuit for
    ** an adder.
    *************************************************************
    synthesize-cla-levels (carry-list, carry-out,
            propagate-list, generate-list,
            size-list-of-lists)
    begin
        while the carry-list has more than one bit in it begin
            synthesize-one-cla-level (propagate-list,
                generate-list, carry-list, first element of
                size-list-of-lists)
            delete first element of size-list-of-lists
            carry-list = carry-list returned by
                synthesize-one-cla-level
            propagate-list = propagate-list returned by
                synthesize-one-cla-level
            generate-list = generate-list returned by
                synthesize-one-cla-level
        end
        synthesize-carry-out (carry-out, last element of
            carry-list, propagate-list, generate-list)
    end

*************************************************************
    ** Synthesize carry-out bit for entire adder.  When this
    ** routine is called, propagate-list and generate-list
    ** should each have just one element.
    *************************************************************
    synthesize-carry-out (carry-out, carry-in,
```

```
              propagate-list, generate-list)
        begin
          temp-bit = generate-unique-name
          and-in-list = list of carry-in and the bit in
              propagate-list
          emit-gate (AND, temp-bit, and-in-list)
          or-in-list = list of temp-bit and the bit in
              generate-list
          emit-gate (OR, carry-out, or-in-list)
        end

************************************************************
        ** Synthesize a carry-lookahead level.
        ************************************************************
        synthesize-one-cla-level (propagate-in-list,
                generate-in-list, carry-out-list, size-list)
        begin
          next-level-propagate-list = empty
          next-level-generate-list = empty
          next-level-carry-list = empty
          while carry-out-list is not empty begin
            size = minimum (first element of size-list, number of
                elements remaining in carry-out-list)
            delete first element of size-list group-propagate-in-list = first size elements from
                propagate-in-list
            delete first size elements from propagate-in-list group-generate-in-list = first size elements from
                generate-in-list
            delete first size elements from generate-in-list group-carry-in = first element from carry-out-list
            delete first element from carry-out-list group-carry-out-list = first (size - 1) elements from
                carry-out-list
            delete first (size - 1) elements from carry-out-list group-propagate-output = generate-unique-name
            append group-propagate-output to
                next-level-propagate-list
            group-generate-output = generate-unique-name
            append group-generate-output to
                next-level-generate-list
            append group-carry-in to next-level-carry-list synthesize-cla-group (group-carry-in,
                group-propagate-in-list, group-generate-in-list,
                group-propagate-output, group-generate-output,
                group-carry-out-list)
        end
```

HP Docket 1092687-1

```
      return next-level-propagate-list,
             next-level-generate-list, next-level-carry-list
   end

***********************************************************
   ** Synthesize a carry-lookahead group.  This means emit
   ** gates to compute the propagate-output bit, the
   ** generate-output bit, and a carry-out bit for each
   ** element of the carry-out-list.
   ***********************************************************
   synthesize-cla-group (carry-in, propagate-in-list,
            generate-in-list, propagate-output,
            generate-output, carry-out-list)
   begin
      synthesize-group-propagate (propagate-output,
            propagate-in-list)
      synthesize-group-generate (propagate-in-list,
            generate-in-list, generate-output)
      synthesize-group-carrys (carry-in, propagate-in-list,
            generate-in-list, carry-out-list)
   end

***********************************************************
   ** Part of synthesize-cla-group.  Emit gate to compute
   ** group propagate.
   ***********************************************************
   synthesize-group-propagate (propagate-output,
         propagate-in-list)
   begin
      emit-gate (AND, propagate-output, propagate-in-list)
   end

***********************************************************
   ** Part of synthesize-cla-group.  Synthesize group
   ** generate bit.
   ***********************************************************
   synthesize-group-generate (propagate-in-list,
            generate-in-list, generate-output)
   begin
      term-list = empty
      while generate-list has more than one element begin
         delete first element from propagate-in-list
         term-output = generate-unique-name
         append term-output to term-list
         term-inputs = append first element of generate-list
               to propagate-in-list
         emit-gate (AND, term-output, term-inputs)
         delete first element from generate-list
      end
      append final element in generate-list to term-list
      emit-gate (OR, generate-output, term-list)
``` end

```
****************************************************
** Part of synthesize-cla-group.  Synthesize group carry
** bits.
****************************************************
synthesize-group-carrys (carry-in, propagate-in-list,
         generate-in-list, carry-out-list)
begin
   for i = 1 to (number of elements in carry-out-list)
   begin
      temp-prop-in-list = first i elements from
         propagate-in-list
      temp-gen-in-list = first i elements from
         generate-in-list
      carry-out = i'th element from carry-out-list
      synthesize-one-group-carry (carry-in, carry-out,
         temp-prop-list, temp-gen-list)
   end
end

****************************************************
** Emit the gates to compute one group carry.  See
** synthesize-group-carrys.
****************************************************
synthesize-one-group-carry (carry-in, carry-out,
         propagate-in-list, generate-in-list)
begin
   term-list = empty
   prepend carry-in to generate-list
   n = number of elements in propagate-in-list
   for i = 1 to n begin
      term-output = generate-unique-name
      append term-output to term-list
      and-in-list = prepend i'th element of
            generate-in-list to last
            (n - i + 1) elements of propagate-in-list
      emit-gate (AND, term-output, and-in-list)
   end
   or-in-list = append last element of generate-in-list to
      term-list
   emit-gate (OR, carry-out, term-list)
end

****************************************************
** Emit a gate to the netlist.  If gate-type is AND,
** output-name is A, and input-name-list is (B, C), then
** an AND gate is created which drives the net A and has
** two inputs driven by
** the nets B and C.
****************************************************
```

HP Docket 1092687-1

```
emit-gate (gate-type, output-name, input-name-list)
begin
   ...
end
```

Although the computer-aided method is used to design a carry-lookahead adder, the same method can be used to design other electronic circuits. The basic idea remains the same. Every type of circuit can be represented by a few essential parameters in a computer. By entering the few parameters in the computer, a user designs and tunes the circuit.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

I claim:

1. A computer-aided method of designing a carry-lookahead adder of the kind that adds two binary numbers and an input-carry bit in a computer, the method comprising:

entering into the computer a length-number specifying the length of the binary numbers, the computer, responding to the length-number, automatically providing a first structure by:

creating a plurality of logic blocks, and formulating for each logic block a logic circuit to receive one bit from each binary number and to produce a propagate and a generate bit; and entering into the computer a list of blocks-in-group numbers, the computer responding to the blocks-in-group numbers automatically providing a second structured by:

arranging the plurality of logic blocks created in the preceding step into a plurality of groups, each group sequentially using one of the blocks-in-group numbers, creating a next-level logic block for each group, formulating for each next-level logic block a logic circuit that receives the propagate and the generate bits from all the blocks in one of the groups of preceding-level logic blocks, and produces a propagate bit PLp and a generate bit GLp, if the blocks-in-group numbers in the list have not all been used, then repeating from the step of "arranging the plurality of logic blocks" and if the blocks-in-group numbers in the list have all been used, then formulating a final logic circuit that receives the input-carry bit, the propagate PLp and the generate GLp bit from the preceding step, and produces an output-carry bit of the adder, which is equal to (PLp * the input-carry bit + Glp);

such that according to the numbers entered, the computer formulates the logic circuits to produce the output-carry bit of the carry-lookahead adder.

2. A computer-aided method as recited in claim 1 wherein the computer automatically provides:

the first structure by formulating the logic circuit for each logic block so that its propagate bit is the logic sum of its received bits, and its generate bit is the logic product of its received bits; and the second structure by formulating the logic circuit for each logic block so that its propagate bit is the logic product of all its received propagate bits, and its generate bit is equal to:

$$G0+(G1 * P0)+(G2 * P0 * P1)+\ldots+(G(n-1) * P0 * \ldots * P(n-2)),$$

where G0 to G(n−1) are its received generate bits, and P0 to P(n−2) are its received propagate bits.

3. A computer-aided method as recited in claim 1 further comprising the computer producing a plurality of sum bits for the two binary numbers by automatically providing:

the input carry bit from the final logic circuit to its preceding-level logic block;

a carry bit created by each logic block in the second structure to each of its corresponding preceding-level logic blocks; and a sum bit by each of the logic blocks in the first structure.

4. A computer-aided method of designing a carry-lookahead adder of the kind that adds two binary numbers and an input-carry bit in a computer, the method comprising:

entering into the computer a length-number specifying the length of the binary numbers, the computer, responding to the length-number, automatically providing a first structure by:

creating a plurality of logic blocks, and formulating for each logic block a logic circuit to receive one bit from each binary number and to produce a propagate and a generate bit; and entering into the computer a list of blocks-in-group numbers, the computer responding to the blocks-in-group numbers automatically providing a second structure by:

arranging the plurality of logic blocks created in the preceding step into one or more groups, each group sequentially using one of the blocks-in-group numbers in the list to specify the number of logic blocks in the group, creating a next-level logic block for each group, formulating for each next-level logic block a logic circuit that receives the propagate and the generate bits from all the blocks in one of the groups of preceding-level logic blocks, and produces a propagate bit PLp, a generate bit GLp, if the blocks-in-group numbers in the list have not all been used, then repeating from the step of "arranging the plurality of logic blocks" and if the blocks-in-group numbers in the list have all been used, then joining sequentially the logic blocks designed in the preceding step, the first logic block receiving the input-carry bit of the adder, every logic block sequentially generating a carry bit that is received by its immediately next logic block and that is equal to (its PLp * its received carry bit + its Glp), and the carry bit generated by the last logic block being an output-carry bit of the adder;

such that according to the numbers entered, the computer formulates the logic circuits to produce the output-carry bit of the carry-lookahead adder.

5. A computer-aided method as recited in claim 4 wherein the computer automatically provides:

the first structure by formulating the logic circuit for each logic block so that its propagate bit is the logic sum of its received bits, and its generate bit is the logic product of its received bits; and the second structure by formulating the logic circuit for each logic block so that its propagate bit is the logic product of all its received propagate bits, and its generate bit is equal to:

$$G0+(G1 * P0)+(G2 * P0 * P1)+\ldots+(G(n-1) * P0 * \ldots * P(n-2)),$$

where G0 to G(n−1) are its received generate bits, and P0 to P(n−2) are its received propagate bits.

* * * * *